US008279602B2

(12) United States Patent
Sivanandan et al.

(10) Patent No.: US 8,279,602 B2
(45) Date of Patent: Oct. 2, 2012

(54) COMMUNICATIONS CABINET WITH PROJECTILE RESISTANT VENTS

(75) Inventors: Deepak Kumar Sivanandan, Richardson, TX (US); Alan James Skrepcinski, Plano, TX (US); Walter Mark Hendrix, Richardson, TX (US); Mark George Spaulding, Wylie, TX (US)

(73) Assignee: CommScope, Inc., Hickory, NC (US)

( * ) Notice: Subject to any disclaimer, the term of this patent is extended or adjusted under 35 U.S.C. 154(b) by 197 days.

(21) Appl. No.: 12/904,367

(22) Filed: Oct. 14, 2010

(65) Prior Publication Data

US 2011/0085300 A1 Apr. 14, 2011

Related U.S. Application Data

(60) Provisional application No. 61/251,506, filed on Oct. 14, 2009.

(51) Int. Cl.
*H05K 7/20* (2006.01)

(52) U.S. Cl. ............ 361/695; 361/679.48; 361/690; 361/694; 165/104.33; 165/122; 165/185; 174/50; 174/50.51; 174/67; 312/223.3; 312/236; 454/184

(58) Field of Classification Search .................. 361/679.46–679.49, 690–696, 722–728, 361/831; 165/80.2, 80.3, 104.33, 104.34, 165/121–126, 185; 174/50, 50.51, 67; 454/184, 454/275, 280, 283, 367, 368; 312/223.2, 312/223.3, 236
See application file for complete search history.

(56) References Cited

U.S. PATENT DOCUMENTS

| 4,449,764 | A | * | 5/1984 | Hastings | 312/236 |
|---|---|---|---|---|---|
| 4,557,095 | A | * | 12/1985 | Rice et al. | 52/473 |
| 4,860,163 | A | * | 8/1989 | Sarath | 361/695 |
| 5,372,543 | A | * | 12/1994 | Steele | 454/184 |
| 5,484,012 | A |   | 1/1996 | Hiratsuka |  |
| 5,573,562 | A | * | 11/1996 | Schauwecker et al. | 55/385.4 |
| 5,697,840 | A |   | 12/1997 | Bainbridge |  |
| 6,088,225 | A |   | 7/2000 | Parry |  |
| 6,123,266 | A |   | 9/2000 | Bainbridge |  |
| 6,164,369 | A | * | 12/2000 | Stoller | 165/104.33 |
| 6,309,296 | B1 | * | 10/2001 | Schwenk et al. | 454/184 |
| 6,579,168 | B1 | * | 6/2003 | Webster et al. | 454/184 |
| 6,643,130 | B1 | * | 11/2003 | DeMarchis et al. | 361/695 |
| 6,749,498 | B2 |   | 6/2004 | Pfister |  |
| 6,751,479 | B1 |   | 6/2004 | Knight |  |
| 6,788,535 | B2 |   | 9/2004 | Dodgen |  |
| 6,881,141 | B2 |   | 4/2005 | Knight |  |
| 6,887,149 | B2 |   | 5/2005 | Palmer |  |
| 6,932,696 | B2 |   | 8/2005 | Schwartz |  |
| 7,061,763 | B2 |   | 6/2006 | Tsoi |  |
| 7,170,010 | B1 | * | 1/2007 | Yapp et al. | 174/135 |
| 7,862,410 | B2 | * | 1/2011 | McMahan et al. | 454/184 |
| 2003/0160130 | A1 | * | 8/2003 | Novak et al. | 244/129.5 |
| 2009/0096918 | A1 | * | 4/2009 | Montelongo | 348/375 |

* cited by examiner

*Primary Examiner* — Michail V Datskovskiy
(74) *Attorney, Agent, or Firm* — Muncy, Geissler, Olds & Lowe, PLLC

(57) ABSTRACT

A communications cabinet includes a housing defining a location for mounting communications equipment, the housing having a wall formed of a first material with a first penetration resistance, a vent opening in the wall, and a door. At least one plate of material having a second penetration resistance greater than or about equal to the first penetration resistance is mounted between the vent opening and the location for mounting the communications equipment, and the plate is positioned to stop projectiles larger than a given size from traveling in a straight line from the at least one vent opening to the location for mounting communication equipment while leaving an airflow path from the vent opening to the location for mounting the communications equipment that passes around at least one edge of the plate of material through a gap between the at least one plate and the wall.

20 Claims, 5 Drawing Sheets

COMMUNICATIONS CABINET WITH PROJECTILE RESISTANT VENTS

CROSS-REFERENCE TO RELATED APPLICATIONS

The present application claims the benefit of U.S. Provisional Patent Application No. 61/251,506 filed Oct. 14, 2009, the entire contents of which is hereby incorporated by reference.

FIELD OF THE INVENTION

The present invention is directed to a communications cabinet having projectile resistant vents, and more specifically, toward a communications cabinet having a penetration resistant plate of material mounted between a vent opening and equipment inside the cabinet and having an airflow pathway around an edge of the plate for allowing adequate airflow to the equipment.

BACKGROUND OF THE INVENTION

Outdoor cabinets for electronic and/or telecommunication equipment and connection panels are known in the art. The equipment in these cabinets generally must be maintained within a certain temperature range in order to function properly, and some of this equipment generates heat that must be dissipated. Direct air cooling is a common method for removing excess heat from such cabinets, especially when the equipment in the cabinet generates a relatively large amount of heat. In such systems, vents are also provided for allowing heat to escape from the cabinet interior and for allowing an airflow to pass through the cabinet over and around the equipment, which airflow may be produced or assisted by one or more fans. Screens or filters may also be provided to reduce the amount of particulate matter that finds its way into the cabinet interior, and any vent openings may be louvered to protect the cabinet interior from rain.

Such cabinets may be located in areas where hunting occurs, and the cabinets are sometimes struck by stray bullets and shotgun pellets. The steel or other material from which the cabinets and their doors are typically constructed is generally strong enough to prevent penetration by stray bullets and pellets. However, the vent openings are often not so well protected, and shotgun pellets and/or bullets may pass easily through such openings and the air filters and/or fans near these openings and damage the electronic or communication equipment housed in the cabinets.

Vent openings are typically covered by screens and/or louvers to keep out insects and rain. One possible approach to protecting communications equipment from stray projectiles would be to cover the openings with screens or louvers having an opening size smaller than the smallest projectile from which protection is required. However, shotgun pellets may be 0.089 inches (2.026 mm) in diameter or smaller. If the vent openings were made this size or smaller, airflow would be greatly restricted and it would be impracticable to create a sufficient airflow through the cabinet for cooling. It would therefore be desirable to protect equipment in a communication cabinet from damage from stray bullets and pellets that enter the cabinet through vent openings without substantially restricting airflow through the cabinet.

SUMMARY OF THE INVENTION

These problems and others are addressed by embodiments of the present invention, a first aspect of which comprises a communications cabinet having a housing with a wall formed a first material having a first penetration resistance and at least one vent opening in the wall. The cabinet also includes a door for providing selective access to an interior of the housing, and there is a location in the interior of the housing for mounting communications equipment. At least one plate of material having a second penetration resistance greater than or about equal to the first penetration resistance and an area greater than or about equal to the first area is mounted between the vent opening and the location for mounting the communications equipment, and that plate is positioned to stop projectiles larger than a given size from traveling in any straight line from the at least one vent opening to the location for mounting communication equipment. The plate in part defines at least one airflow path from the vent opening to the location for mounting the communications equipment which airflow path passes around at least one edge of the plate of material through a gap between the at least one plate and the wall.

Another aspect of the invention comprises a communications cabinet door that has a first door panel having a plurality of vent openings and a second door panel having an aperture and that defines with the first door panel a door interior. An air filter is mounted at the aperture and configured to filter substantially all air passing through the aperture, and at least one metal plate is mounted in the door interior adjacent the aperture between each opening of the plurality of openings and the aperture. The at least one metal plate is spaced from the second door panel to define an airflow path between the at least one metal plate and the second door panel.

An additional aspect of the invention comprises a communications cabinet having a housing with a wall formed of a first material having a first penetration resistance, communications equipment mounted in the interior and a door for providing selective access to the interior. The door comprises a first door panel having a plurality of vent openings and a second door panel having an aperture and defining with the first door panel a door interior. A frame is mounted in the aperture and an air filter is mounted in the frame and positioned to filter substantially all air passing through the frame. A fan tray is sealingly mounted against the frame for drawing air through the air filter and into the interior of the housing. At least one metal plate is mounted in the door interior adjacent the frame and defines with the frame at least one airflow path from the plurality of vent openings to the filter. The at least one metal plate is positioned to stop projectiles larger than a given size from traveling in a straight line from one of the plurality of vent openings to the filter and includes a plurality of openings each having a diameter less than or equal to the given size.

BRIEF DESCRIPTION OF THE DRAWINGS

These and other aspects and features of embodiments of the present invention will be better understood after a reading of the following detailed description together with the attached drawings wherein.

DETAILED DESCRIPTION

Figures 1, 2:
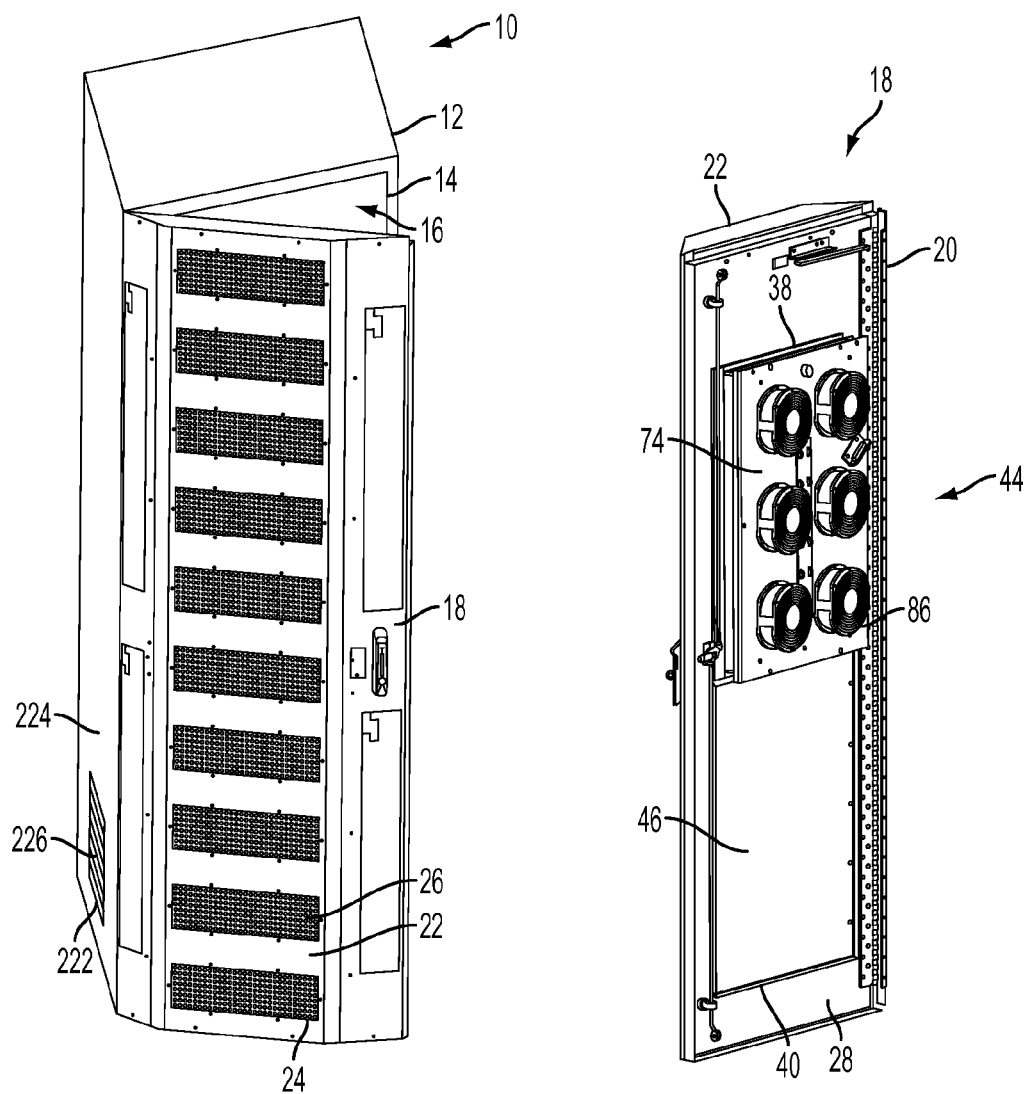
FIG. 1 is a perspective view of a communications cabinet according to an embodiment of the present invention with a door shown in a partially open position.
FIG. 2 is a rear perspective view of the door of FIG. 1, removed from the communications cabinet for illustration purposes.

The present invention now is described more fully hereinafter with reference to the accompanying drawings, in which embodiments of the invention are shown. This invention may, however, be embodied in many different forms and should not be construed as limited to the embodiments set forth herein; rather, these embodiments are provided so that this disclosure will be thorough and complete, and will fully convey the scope of the invention to those skilled in the art.

Like numbers refer to like elements throughout. In the figures, the thickness of certain lines, layers, components, elements or features may be exaggerated for clarity.

The terminology used herein is for the purpose of describing particular embodiments only and is not intended to be limiting of the invention. Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the specification and relevant art and should not be interpreted in an idealized or overly formal sense unless expressly so defined herein. Well-known functions or constructions may not be described in detail for brevity and/or clarity.

As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. As used herein, phrases such as "between X and Y" and "between about X and Y" should be interpreted to include X and Y. As used herein, phrases such as "between about X and Y" mean "between about X and about Y." As used herein, phrases such as "from about X to Y" mean "from about X to about Y."

It will be understood that when an element is referred to as being "on", "attached" to, "connected" to, "coupled" with, "contacting", etc., another element, it can be directly on, attached to, connected to, coupled with or contacting the other element or intervening elements may also be present. In contrast, when an element is referred to as being, for example, "directly on", "directly attached" to, "directly connected" to, "directly coupled" with or "directly contacting" another element, there are no intervening elements present. It will also be appreciated by those of skill in the art that references to a structure or feature that is disposed "adjacent" another feature may have portions that overlap or underlie the adjacent feature.

Spatially relative terms, such as "under", "below", "lower", "over", "upper", "lateral", "left", "right" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is inverted, elements described as "under" or "beneath" other elements or features would then be oriented "over" the other elements or features. The device may be otherwise oriented (rotated 90 degrees or at other orientations) and the descriptors of relative spatial relationships used herein interpreted accordingly.

As used herein, "penetration resistance" refers to the ability of an object to stop a projectile such as a bullet or shotgun pellet from passing through the object. Communications cabinets are generally not bulletproof, and a direct shot at close range from a high caliber rifle may be able to penetrate any part of a cabinet. However, conventional cabinets are often made from steel sheets which provide protection from shotgun blasts at distances of over about fifty feet. That is to say, a common size pellet, no. 6 steel shot, for example, fired from a 12-gauge shotgun at about fifty feet, will not penetrate a conventional steel cabinet and will not damage the communications equipment in the cabinet. Vent openings in the cabinet, however, generally exhibit a penetration resistance that is less that of the overall cabinet. Some vent openings provide a direct line of sight exposure to communications equipment therein; others are protected by louvers which provide some protection, but still offer less resistance than a sheet of steel. Some vent openings are covered by air filters and/or fans, but these objects too have a lower level of penetration resistance than a sheet of steel.

Figure 4:
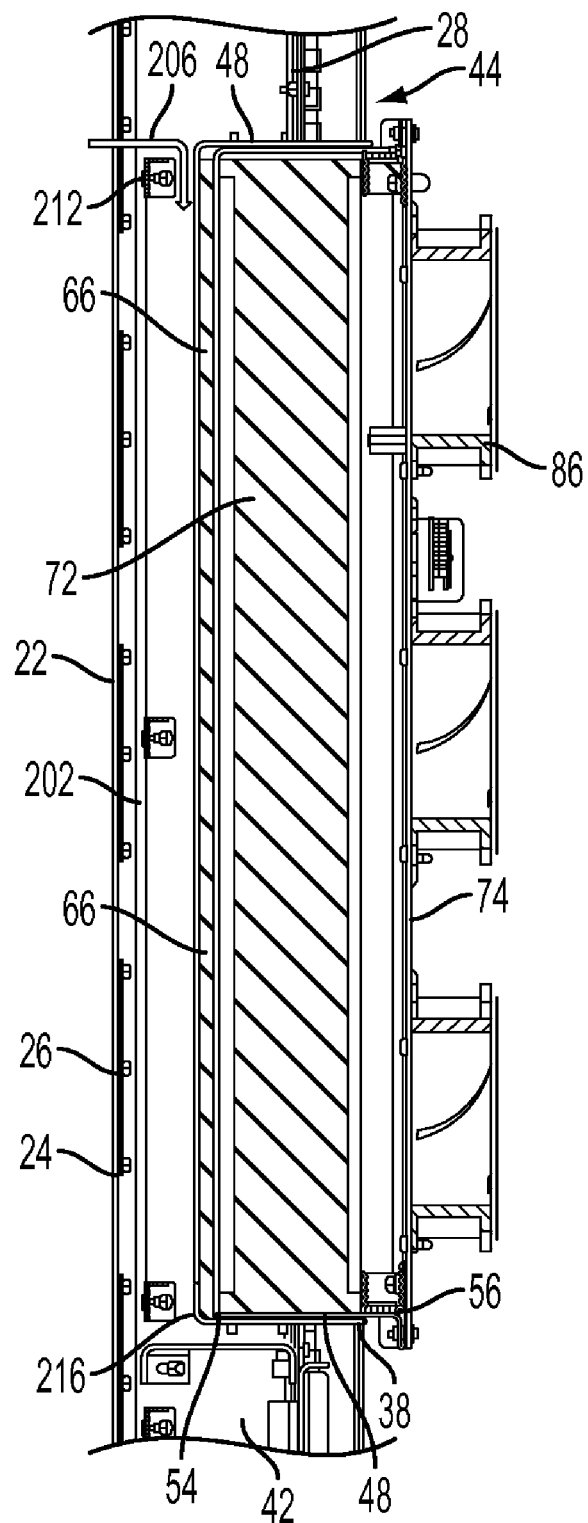
FIG. 4 is a sectional side elevational view of a portion of the door of FIG. 2.
Figure 5:
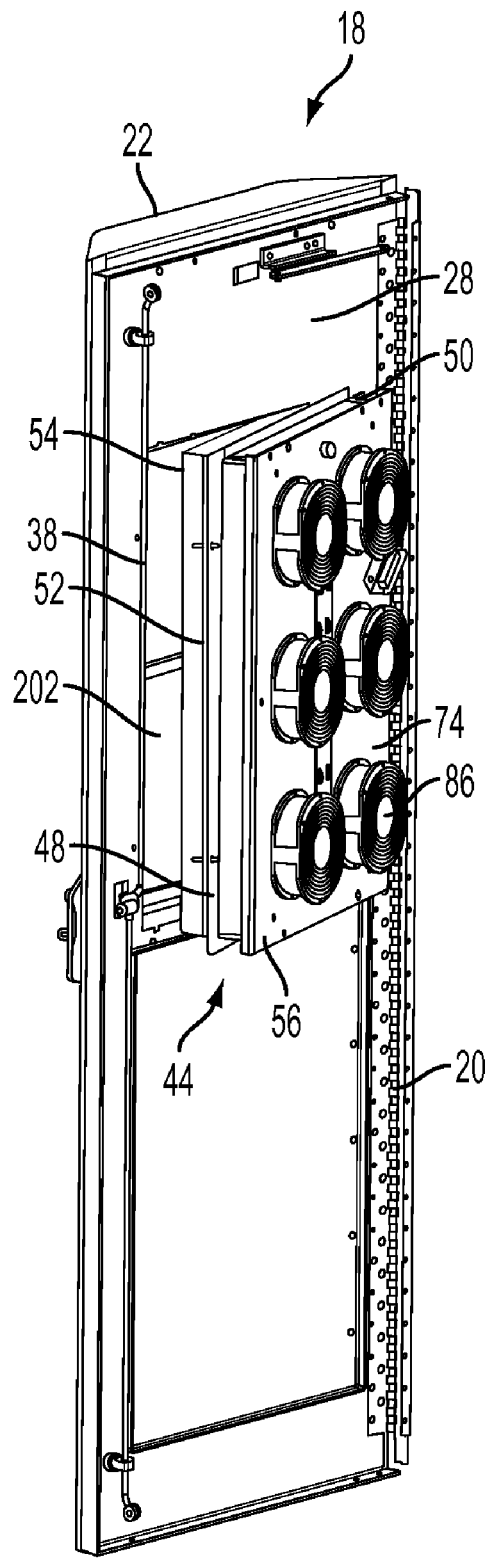
FIG. 5 is a perspective view of the door of FIG. 2 showing a hinged frame for supporting fans and filters partially pivoted away from an aperture in a door panel.
Figure 6:
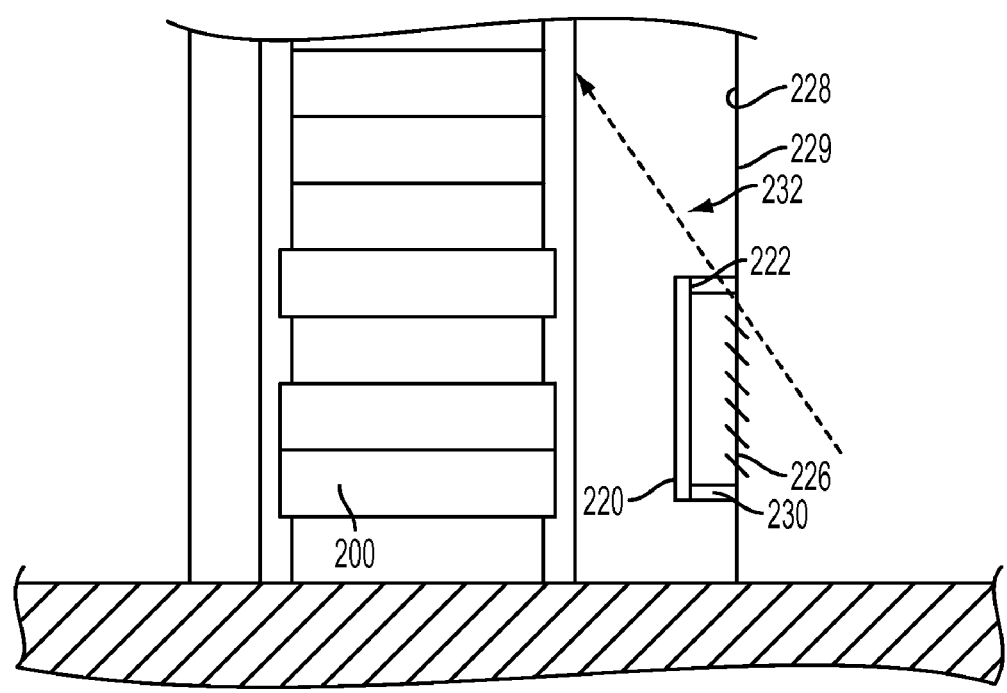
FIG. 6 is a sectional side elevational view of a rear portion of the communications cabinet of FIG. 1 showing a second vent opening protected by a second protective plate.

Referring now to FIG. 1, a cabinet 10 according to an embodiment of the present invention includes a housing 12 having an opening 14 into an interior 16 in which electronic or communication equipment, 200 in FIG. 6, is housed. A door 18 is mounted by opening 14 and is connected to the housing by a hinge 20 for allowing access to interior 16 when open and for protecting the contents of the housing from the elements and unauthorized individuals when closed and, optionally, locked. Door 18 includes an outer panel 22 having a plurality of vent openings 24 covered by screens 26 and an inner panel 28 illustrated in FIGS. 2, 4 and 5. Inner panel 28 includes first and second individual apertures 38 and 40. As illustrated in FIG. 4, a space 42 between the outer panel 22 and the inner panel 28 comprises the door interior and provides sound and heat insulation and accommodates part of a fan box 44 described hereafter. When only a single fan box 44 is needed, second aperture 40 is sealed off by a removable panel 46 mounted thereover as illustrated, for example, in FIG. 2. When it is necessary or desirable to move a greater quantity of air, panel 46 is removed and a second fan box (not illustrated) is mounted in second aperture 40.

Referring now to FIG. 5, fan box 44 comprises a frame 48 having a first side portion 50, a second side portion 52, a front side 54 facing in the direction of door outer panel 22 and a rear side 56 facing in the direction of interior 16 when door 18 is closed. First side portion 50 is connected to inner panel 28 next to first aperture 38 by a hinge, not illustrated, allowing fan box 44 to pivot away from first aperture 38 as illustrated in FIG. 5.

With reference to FIG. 4, a first filter 66 is mounted in a frame 48 such that it fits snuggly within frame 48 in order to filter substantially all air passing through frame 48. First filter 66 may comprise a disposable filter or a reusable filter, and reusable filters sold under the brand name QUADRAFOAM by the Universal Air Filter Company of Sauget, Ill. have been found to be suitable for this application. A second filter 72 is mounted in frame 48 adjacent to first filter 66, and this second filter 72 comprise a hydrophobic filter configured to substantially prevent the passage of particulate matter that is not trapped by first filter 66 and likewise to substantially prevent water from entering cabinet 10 through fan box 44. A suitable hydrophobic filter is an ePTFE (Expanded Polytetrafluoroethylene) based filter available from W. L. Gore & Associates. Second filter 72 will generally be more expensive than first filter 66, but because second filter 72 filters air that has already been filtered by first filter 66, it will require less frequent cleaning or replacement. A fan tray 74 is mounted to frame 48 in a manner that forms a seal with the frame 48 so that when fans 86 of fan tray 74, air is drawn through first filter 66 and second filter 72 of frame 48.

Figure 3:
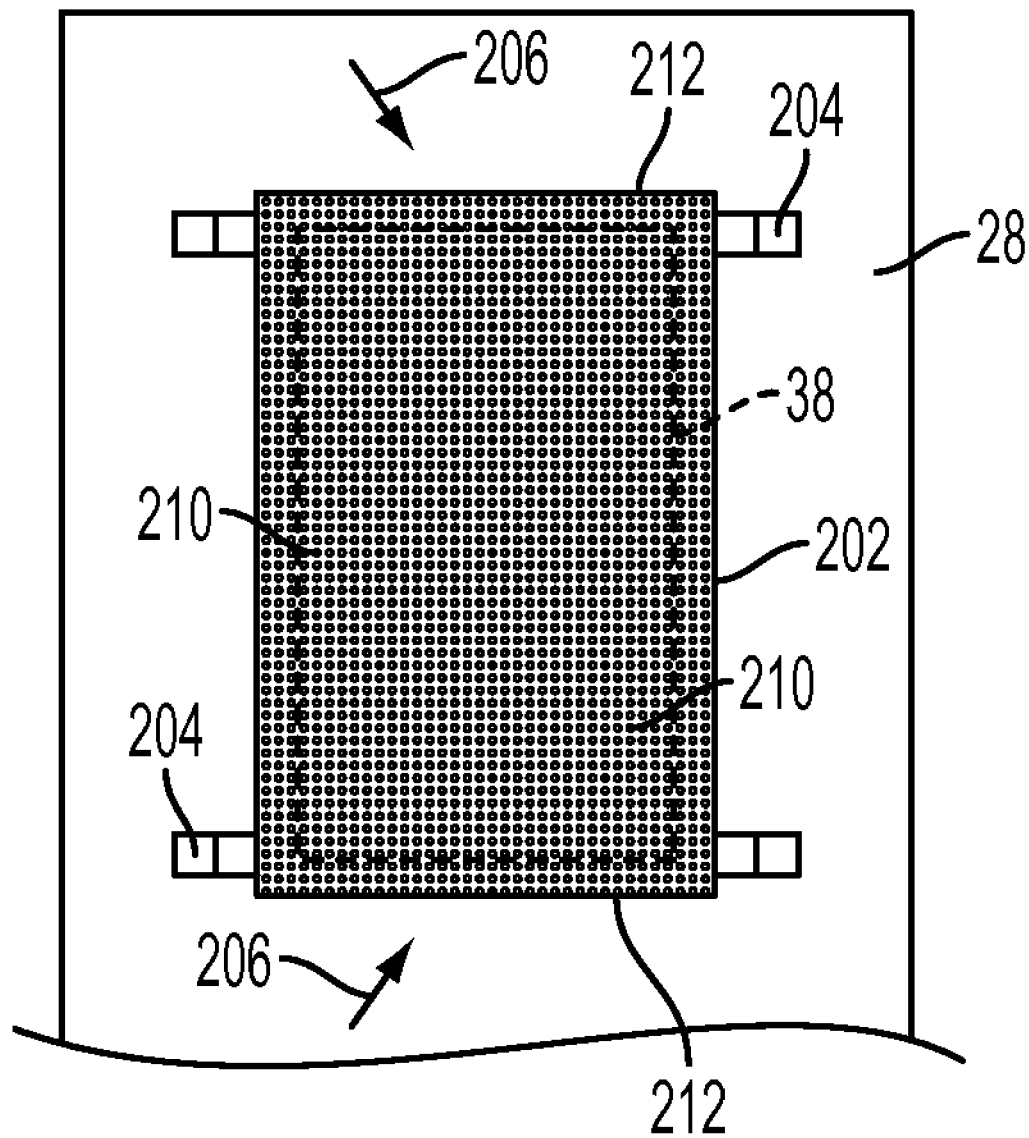
FIG. 3 is a front elevational view of a protective metal sheet mounted over an aperture in a door panel of the door of FIG. 2.

FIGS. 3 and 4 illustrate a protective metal plate 202 mounted adjacent first aperture 38 in inner panel 28 by a plurality of legs 204 which connect the plate 202 to the inner door panel 28. Metal plate 202 is preferably formed from a 0.125 inch (3.175 mm) to 0.25 inch (6.35 mm) steel sheet which may comprise the same material used to form housing 12. Legs 204 hold the protective metal plate a distance away from first filter 66 in order to leave a plurality of airflow paths 206 around the edges 208 of the metal plate 202. Alternately, protective metal plate 202 could be secured to the inner side of outer door panel 22 or to any other structure in door interior space 42 in manner that maintains the same relationship between the metal plate 202 and the first filter 66.

Metal plate 202 optionally includes a plurality of holes 210 which are preferably sized to be smaller that the smallest size shotgun pellet against which protection is desired. Number 8 shot has a diameter of about 0.089 inches (2.026 mm), and holes 210 should be have a diameter no larger than this size to prevent such pellets from passing through one of the openings in the metal plate 202 and damaging the first or second filters 66, 72, fans 86 or communications equipment 200 located inside the cabinet 10. Holes 210 allow for increased airflow to first filter 66 through the metal plate 202; however, with the proper selection of fans 86, sufficient air for cooling communication equipment 200 can be drawn around the edges 208 of metal plate 202 rendering holes 210 in plate 202 unnecessary.

The size of plate 202 and spacing from first filter 66 are selected so to avoid substantially all straight line paths from one of vent openings 26 in outer door panel 22 to first aperture 38. If metal plate 202 is located very close to first aperture 38, the size of the plate does not need to be significantly greater that the size of the first aperture 38 since a pellet or bullet would have to enter the cabinet nearly parallel to door inner panel 28 to fit between the metal plate 202 and the door panel, and at such a shallow angle, the bullet would not reach the communications equipment 200 in the cabinet 10. If metal plate 202 is mounted further away from first aperture 38, to provide a larger airflow path, for example, the metal plate 202 must be larger than the opening to cut off any straight line approaches from the outside of the cabinet to the communications equipment 200. It is noted that inner door panel 28 is constructed of material such as steel having a penetration resistance similar to that of the housing 12, and thus bullets or pellets that reach the inner wall door panel 28 will also be prevented from entering the interior 16 of the cabinet.

In operation frame 48 is secured in first aperture 38 as illustrated in FIG. 2, and the fans are operated to draw air into housing 12 through first filter 66 and second filter 72. Air reaches first filter 66 by traveling along an airflow path 206 from vent openings 24 in outer door panel 22 around edges 208 of metal plate 202 through the gap 216 between the plate 202 and the inner door panel 28 and, if holes 210 are provided in metal plate 202, through these holes 210 as well. Preferably, metal plate 202 is mounted such that airflow path 206 extends around all sides of the metal plate 202 to reduce restrictions in the airflow path 206.

FIG. 6 illustrates an alternate arrangement for mounting a protective metal plate 220 in association with a vent opening 222 formed in a wall 224 of the housing 12. Vent opening 222 includes a plurality of louvers 226 which provide protection from rain but may not stop shotgun pellets from entering the housing 12. Metal plate 220 is mounted at a small distance from the inner side 228 of wall 224 by posts 230 and may, optionally, include a plurality of holes (not illustrated) like holes 210 of metal plate 202 which are smaller than the smallest size of the shotgun pellets from which protection is desired.

The spacing between metal plate 220 and inner side 228 of wall 224 is selected to eliminate any straight line path that a shotgun pellet could follow from outside the housing 12 to the communications equipment 200 mounted therein. It is possible that a given cabinet could have a metal plate mounted in a manner that leaves straight line paths from the opening to communications equipment but does not leave any paths that a shotgun pellet could follow. For example, FIG. 6 illustrates a straight line path 232 from opening 222 to communications equipment 200. However, because vent opening 222 is located close to the ground, a pellet could not be fired along this line from a shotgun unless a hole were dug next to the cabinet to accommodate the approximately 30 inch (76.2 cm) length of the shotgun. If cabinet 10 were mounted on a five foot (1.52 m) platform (not illustrated), on the other hand, protection from projectiles traveling along path 232 would be necessary. The size and placement of metal plate 202 should be based on the directions from which incoming bullets and pellets might be expected.

The present invention has been described in terms of preferred embodiments. However, modifications and additions to these embodiments will become apparent to those of ordinary skill in the relevant art upon a review of the foregoing disclosure. It is intended that all such modifications and additions comprise a part of the present invention to the extent they fall within the scope of the several claims appended hereto.

We claim:

1. A communications cabinet comprising:
   a housing having a wall including at least one vent opening having a first area, the housing being formed of a first material having a first penetration resistance;
   a door for providing selective access to an interior of the housing;
   a location in the interior for mounting communications equipment;
   at least one plate of material having a second penetration resistance greater than or about equal to said first penetration resistance and an area greater than or about equal to said first area mounted between the vent opening and the location for mounting the communications equipment, said at least one plate of material being positioned to stop projectiles larger than a given size from traveling in a straight line from said at least one vent opening to said location for mounting communication equipment; and
   at least one airflow path from the vent opening to the location for mounting the communications equipment, the at least one airflow path passing around at least one edge of the plate of material through a gap between the at least one plate and the wall.

2. The communications cabinet of claim 1, wherein the at least one plate of material includes a plurality of holes having a diameter less than or equal to said given size.

3. The communications cabinet of claim 1, wherein said at least one plate of material is not directly connected to said wall.

4. The communications cabinet of claim 1, wherein a surface of the at least one plate of material facing the at least one vent opening has a periphery enclosing an area greater than or equal to an area of the at least one vent opening.

5. The communications cabinet of claim 1, wherein the vent opening is formed in the door.

6. The communications cabinet of claim 1, wherein the at least one airflow path comprises a first airflow path passing around a first side of the at least one plate of material and a second airflow path passing around a second side of the at least one plate of material.

7. The communications cabinet of claim 1, wherein said vent opening is partially covered by a plurality of louvers.

8. The communications cabinet of claim 5, including:
a fan configured to draw air into the cabinet through the at least one vent opening; and
an air filter in the at least one airflow path for filtering substantially all air drawn into the cabinet by the fan;
wherein said at least one plate of material is mounted in said cabinet between said vent opening and said filter.

9. The communications cabinet of claim 1, wherein
said at least one vent opening comprises first and second vent openings and wherein said at least one plate of material comprises first and second plates of material, said first vent opening being formed in said door and said second vent opening being formed in said wall at a location spaced from said door.

10. The communications cabinet of claim 1 including communications equipment mounted in said location for mounting communications equipment.

11. A communications cabinet door comprising:
a first door panel having a plurality of vent openings;
a second door panel having an aperture and defining with said first door panel a door interior;
an air filter mounted at the aperture and configured to filter substantially all air passing through the aperture;
at least one metal plate mounted in said door interior adjacent said aperture between each opening of said plurality of openings and said aperture, said at least one metal plate being spaced from said second door panel to define an airflow path between said at least one metal plate and said second door panel.

12. The communications cabinet door of claim 11, including at least one fan mounted at the aperture and configured to draw air through said plurality of vent openings, said air filter and said aperture.

13. The communications cabinet door of claim 11, wherein said air filter is mounted in said aperture and including a fan tray in sealing engagement with said aperture for drawing air through said air filter and into said interior.

14. The communications cabinet door of claim 13, including a frame hingedly mounted to said second door panel for pivotal movement relative to said aperture, said filter and said fan tray being supported by said frame.

15. The communications cabinet door of claim 14, wherein said plate is mounted to said second door panel.

16. The communications cabinet door of claim 11 wherein said at least one metal plate is positioned to stop projectiles larger than a given size from traveling in a straight line from said first door panel to said filter.

17. The communications cabinet door of claim 16, wherein said at least one metal plate includes a plurality of openings each having a diameter less than or equal to said given size.

18. The communications cabinet door of claim 11, including:
a second vent opening in said housing;
wherein said at least one metal plate comprises a first metal plate and a second metal plate, said first metal plate being mounted on said door and said second metal plate being mounted between said second vent opening and said communications equipment; and
an airflow path from said second vent opening to said communication equipment, said second airflow path passing around an edge of said second metal plate.

19. A communications cabinet including a communications cabinet door according to claim 11.

20. A communications cabinet comprising:
a housing having an interior and a wall formed of a first material having a first penetration resistance;
communications equipment mounted in the interior; and
a door for providing selective access to the interior,
the door comprising:
a first door panel having a plurality of vent openings;
a second door panel having an aperture and defining with said first door panel a door interior;
a frame mounted in said aperture;
an air filter mounted in the frame and configured to filter substantially all air passing through the frame;
a fan tray in sealing engagement with said frame for drawing air through said air filter and into said interior;
at least one metal plate mounted in said door interior adjacent said frame and defining with said frame at least one airflow path from said plurality of vent openings to said filter;
said at least one metal plate being positioned to stop projectiles larger than a given size from traveling in any straight line from one of said plurality of vent openings to said filter,
said at least one metal plate includes a plurality of openings each having a diameter less than or equal to said given size.

* * * * *